US011084933B2

(12) United States Patent
Kim et al.

(10) Patent No.: US 11,084,933 B2
(45) Date of Patent: Aug. 10, 2021

(54) DYE COMPOUND AND PHOTOPOLYMER COMPOSITION

(71) Applicants: LG CHEM, LTD., Seoul (KR); KOREA ADVANCED INSTITUTE OF SCIENCE AND TECHNOLOGY, Daejeon (KR)

(72) Inventors: Heon Kim, Daejeon (KR); Yoosik Kim, Daejeon (KR); Raisa Kharbash, Daejeon (KR); Se Hyun Kwon, Daejeon (KR); Yeongrae Chang, Daejeon (KR); Seokhoon Jang, Daejeon (KR)

(73) Assignees: LG CHEM, LTD., Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/651,906

(22) PCT Filed: Dec. 7, 2018

(86) PCT No.: PCT/KR2018/015464
§ 371 (c)(1),
(2) Date: Mar. 27, 2020

(87) PCT Pub. No.: WO2019/117538
PCT Pub. Date: Jun. 20, 2019

(65) Prior Publication Data
US 2020/0263038 A1 Aug. 20, 2020

(30) Foreign Application Priority Data

Dec. 15, 2017 (KR) .................. 10-2017-0173544
Dec. 6, 2018 (KR) .................. 10-2018-0156151

(51) Int. Cl.
| | |
|---|---|
| *C09B 57/00* | (2006.01) |
| *C08K 5/55* | (2006.01) |
| *C07F 5/02* | (2006.01) |
| *G03H 1/02* | (2006.01) |
| *G03F 7/028* | (2006.01) |
| *G03F 7/033* | (2006.01) |
| *G03F 7/035* | (2006.01) |
| *G03H 1/04* | (2006.01) |

(52) U.S. Cl.
CPC .............. *C09B 57/00* (2013.01); *C07F 5/02* (2013.01); *C08K 5/55* (2013.01); *G03F 7/028* (2013.01); *G03F 7/033* (2013.01); *G03F 7/035* (2013.01); *G03H 1/02* (2013.01); *G03H 1/0402* (2013.01); *G03H 2001/0264* (2013.01); *G03H 2001/0439* (2013.01); *G03H 2222/12* (2013.01); *G03H 2260/12* (2013.01)

(58) Field of Classification Search
CPC ...... G03F 7/0755; G03F 7/0757; G03F 7/033; G03F 7/035; G03F 7/001; G03F 7/105; G03F 7/0758; G03F 7/028; C09B 57/00; G03H 2001/0439; G03H 2001/0264; G03H 2260/12; G03H 2222/12; G03H 1/02; G03H 1/0402
See application file for complete search history.

(56) References Cited

U.S. PATENT DOCUMENTS

| | | | | |
|---|---|---|---|---|
| 5,948,593 | A * | 9/1999 | Misawa | C07D 403/06 430/270.16 |
| 6,016,999 | A * | 1/2000 | Simpson | B64G 1/1007 244/159.5 |
| 6,060,606 | A | 5/2000 | Misawa et al. | |
| 6,066,378 | A | 5/2000 | Morii et al. | |
| 6,106,999 | A * | 8/2000 | Ogiso | G03F 7/029 430/281.1 |
| 6,506,468 | B1 | 1/2003 | Morii et al. | |
| 6,815,027 | B2 | 11/2004 | Morii et al. | |
| 6,835,430 | B2 | 12/2004 | Morii et al. | |
| 6,887,546 | B2 | 5/2005 | Morii et al. | |
| 7,910,186 | B2 | 3/2011 | Morii et al. | |
| 2003/0087104 | A1 * | 5/2003 | Dhar | G03F 7/001 428/422.8 |
| 2004/0250016 | A1 | 12/2004 | Hanks | |

(Continued)

FOREIGN PATENT DOCUMENTS

| | | |
|---|---|---|
| CN | 1175058 A | 3/1998 |
| CN | 101631839 A | 1/2010 |
| CN | 102272971 A | 12/2011 |
| CN | 102792377 A | 11/2012 |
| CN | 104684918 A | 6/2015 |
| JP | H11-302551 A | 11/1994 |
| JP | H09-106241 A | 4/1997 |
| JP | H10-097173 A | 4/1998 |
| JP | 11-352686 * | 12/1999 |
| JP | H11-352686 A | 12/1999 |

(Continued)

OTHER PUBLICATIONS

Luo et al., "The relationship between the boron dipyrromethene (BODIPY) structure and the effectiveness of homogeneous and heterogeneous solar hydrogen-generating systems as well as DSSCs", Phys Chem. Chem. Phys., vol. 17, pp. 9716-9729 (Mar. 2015).*

(Continued)

*Primary Examiner* — Martin J Angebranndt
(74) *Attorney, Agent, or Firm* — Rothwell, Figg, Ernst & Manbeck, P.C.

(57) ABSTRACT

The present invention relates to a compound having a novel structure, a photopolymer composition including the compound as a dye, a hologram recording medium produced from the photopolymer composition, an optical element including the hologram recording medium, and a holographic recording method using the hologram recording medium.

13 Claims, No Drawings

(56) References Cited

U.S. PATENT DOCUMENTS

| | | | |
|---|---|---|---|
| 2005/0058911 A1* | 3/2005 | Takeyama | G03F 7/001 430/1 |
| 2008/0070124 A1* | 3/2008 | Matsumoto | G11B 7/245 430/2 |
| 2008/0076044 A1 | 3/2008 | Mizukawa et al. | |
| 2008/0223255 A1 | 9/2008 | Gonzalez et al. | |
| 2010/0230647 A1 | 9/2010 | Mizukawa et al. | |
| 2011/0272681 A1* | 11/2011 | Sugimoto | C09K 11/06 257/40 |
| 2012/0138877 A1 | 6/2012 | Mizukawa et al. | |
| 2012/0219884 A1 | 8/2012 | Weiser et al. | |
| 2012/0238752 A1 | 9/2012 | Mizukawa et al. | |
| 2015/0125784 A1 | 5/2015 | Weiser et al. | |
| 2015/0171328 A1 | 6/2015 | Bura et al. | |
| 2017/0293263 A1* | 10/2017 | Kitamura | G03H 1/0005 |
| 2019/0317404 A1* | 10/2019 | Jang | C08L 43/04 |

FOREIGN PATENT DOCUMENTS

| | | |
|---|---|---|
| JP | 2001-240761 A | 9/2001 |
| JP | 2002-169275 A | 6/2002 |
| JP | 2005-114849 A | 4/2005 |
| JP | 2005-115318 A | 4/2005 |
| JP | 2005-189256 A | 7/2005 |
| JP | 2011-221256 A | 11/2011 |
| JP | 2011-241160 * | 12/2011 |
| JP | 2011-241160 A | 12/2011 |
| KR | 10-2009-0094556 A | 9/2009 |
| KR | 10-2010-0079949 A | 7/2010 |
| KR | 10-1474900 B1 | 12/2014 |
| KR | 10-2017-0037499 A | 4/2017 |

OTHER PUBLICATIONS

Shie et al., "An Azido-BODIPY Probe for Glycosylation: Initiation of Strong Fluorescence upon Triazole Formation"JACS, vol. 136 pp. 9953-9961 (2014).*

Shen et al., "Boron-diindomethene (BDI) dyes and their tetrahydrobycycloprecursors-en Route to a new class of highly emissive fluorophors for the red spectral range", Chem. Eur J., vol. 10 pp. 4853-4871 (2004).*

Shrestha et al., "Dual Functionality of BODIPY Chromophore in Porphyrin-Sensitized Nanocrystalline Solar Cells" teaches compound BET.*

Tikhomirova et al., "Diethyl(biscyclohexano)BODIPY* dicarboxylates. Chelation of alkaline-earth metal ions and sensor properties". Russ. J. Org. Chem., vol. 50(2) pp. 229-239 (2014).*

Montejano et al., "Triplet state spectrocscopy of dipyrromethene-BF2 laser dyes", J. Photochem. Photobio. A Chem., vol. 181 pp. 142-146 (2006).*

Machine translation of 11352686 (1999).*

Machine translation of JP 2002-169275 (2002).*

Machine translation of JP 2011-241160 (2011).*

Bartelmess et al., "Boron dipyrromethene (bodipy) functionalized carbon nano-onions for high resolution cellular imaging", Nanoscale vol. 6 pp. 13761-13769 (2014).*

Luca Ravotto, "Coupling chromophores to metal and semiconductor neanoparticles for energy conversion", Thesis Univ., Bologna (2016) 157 pages.*

Ongayi, "Synthesis of symmetric and asymmetric water-soluble porphyrin derivatives", Thesis, Louisiana State, Univ. (2005), 187 pages.*

Madhu et al., "3,5-diformylbroron dipyrromethene as fluorescent pH sensors", Inorg. Chem., vol. 50 pp. 4392-4400 (Apr. 2011).*

International Search Report and Written Opinion issued for International Application No. PCT/KR2018/015464 dated Mar. 21, 2019, 9 pages.

Uppal, T. et al., "Synthesis, Computational Modeling, and Properties of benzo-Appended BODIPYs", Chem. Eur. J., 2012, vol. 18, pp. 3893-3905.

Zhoa, N. et al., "Synthesis and Spectroscopic and Cellular Properties of Near-IR[α]Phenanthrene-Fused 4,4-Difluoro-4-bora-3a,4a-diaza-s-indacenes", J. Org. Chem., Aug. 28, 2017, vol. 82, pp. 9744-9750.

Shrestha, et al., "Dual Functionality of BODIPY Chromophore in Porphyrin-Sensitized Nanocrystalline Solar Cells", J. Phys. Chem., 2012, 116, 10451-10460.

Montejano, et al., "Triplet-state spectroscopy of dipyrromethene-BF2 laser dyes", J. Photoch. Photobio. A., 2006, 181, 142-146.

Tikhomirova, et al., "Diethyl (Biscyclohexano) BODIPY dicarboxylates. Chelation of Alkaline-Earth Metal Ions and Sensor Properties", Russ. J. Org. Chem., 2014, 50(2), 229-239.

Shen, et al., "Boron-Diindomethene (BDI) dyes and Their Tetrahydrobicyclo Precursors-en Route to a New Class of Highly Emissive Fluorophores for the Red Spectral Range", Chem. Eur. J., 2004, 10, 4853-4871.

Shie, et al,"An Azido-BODIPY Probe for Glycosylation: Initiation of Strong Fluorescence upon Triazole Formation", J. Am. Chem. Soc., 2014, 136, 9953-9961.

* cited by examiner

DYE COMPOUND AND PHOTOPOLYMER COMPOSITION

CROSS-REFERENCE TO RELATED APPLICATION

This application is a 35 U.S.C. 371 National Phase Entry Application from PCT/KR2018/015464, filed on Dec. 17, 2018, designating the United States and which claims the benefits of Korean Patent Application No. 10-2017-0173544 filed on Dec. 15, 2017 and Korean Patent Application No. 10-2018-0156151 filed on Dec. 06, 2018 with the Korean Intellectual Property Office, the disclosures of which are incorporated herein by reference in their entirety.

TECHNICAL FIELD

The present invention relates to a dye compound, a photopolymer composition, a hologram recording medium, an optical element, and a holographic recording method.

BACKGROUND ART

Holographic recording medium records information by changing a refractive index in the holographic recording layer in the medium through an exposure process, and reads the change of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Typically, a photopolymer composition for hologram production includes a polymer binder, a monomer, and a photoinitiator, and the photosensitive film produced from such a composition is irradiated with laser interference light to induce photopolymerization of local monomers.

In a portion where a relatively large number of monomers are present in such photopolymerization process, the refractive index becomes high. And in a portion where a relatively large number of polymer binders are present, the refractive index is relatively lowered and thus the refractive index modulation occurs, and a diffraction grating is generated by such refractive index modulation. The refractive index modulation value n is influenced by the thickness and the diffraction efficiency (DE) of the photopolymer layer, and the angular selectivity increases as the thickness decreases.

Recently, development of materials capable of maintaining a stable hologram high diffraction efficiency has been demanded, and also various attempts have been made to manufacture a photopolymer layer having a thin thickness and a large value of refractive index modulation.

DETAILED DESCRIPTION OF THE INVENTION

The present invention provides a compound having a novel structure.

The present invention also provides a photopolymer composition capable of providing a hologram recording medium which can realize a large value of refractive index modulation even while having a thin thickness, and have improved durability against temperature and humidity.

The present invention further provides a hologram recording medium which can realize a large value of refractive index modulation even while having a thin thickness, and have improved durability against temperature and humidity.

The present invention also provides an optical element including the above-described hologram recording medium.

The present invention further provides a holographic recording method including selectively polymerizing photoreactive monomers contained in the photopolymer composition by a coherent laser.

One embodiment of the present invention provides a compound having a novel structure. Such a compound can be used as a dye.

Another embodiment of the present invention provides a photopolymer composition including the compound of a novel structure.

Still another embodiment of the present invention provides a hologram recording medium produced from the photopolymer composition.

An additional embodiment of the present invention provides an optical element including the hologram recording medium.

A further embodiment of the present invention provides a holographic recording method including selectively polymerizing photoreactive monomers contained in the hologram recording medium by a coherent laser.

Hereinafter, a compound having a novel structure, a photopolymer composition, a hologram recording medium, an optical element, and a holographic recording method according to specific embodiments of the present invention will be described in more detail.

As used herein, the term "(meth)acrylate" refers to either metharcrylate or acrylate.

As used herein, the (co)polymer refers to a homopolymer or a copolymer (including random copolymers, block copolymers, and graft copolymers).

Further, the term "hologram" as used herein refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms or holographic stereograms.

As used herein, the alkyl group may be a straight chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment., the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methylbutyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 2-methylpentyl, 4-methylhexyl, 5-methylhexyl, and the like, but are not limited thereto.

As used herein, the alkylene group is a bivalent functional group derived from an alkane, and may be, for example, linear, branched or cyclic methylene group, ethylene group, propylene group, isobutylene group, sec-butylene group, tert-butylene group, pentylene group, hexylene group, etc.

According to one embodiment of the invention, a compound of the following Chemical Formula 1 may be provided.

[Chemical Formula 1]

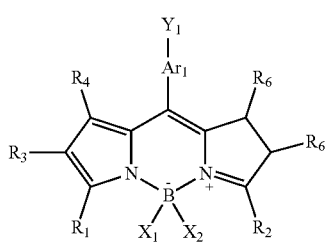

wherein, in Chemical Formula 1, $X_1$ and $X_2$ are the same as or different from each other, and each is hydrogen or an alkyl group having 1 to 20 carbon atoms; a halogen group; a nitrile group; a substituted or unsubstituted alkoxy group having 1 to 20 carbon atoms; a substituted or unsubstituted aryloxy group having 6 to 20 carbon atoms; or a substituted or unsubstituted aryl group having 6 to 20 carbon atoms, $R_1$ and $R_2$ are the same as or different from each other, and each is hydrogen; deuterium; a halogen group; a nitrile group; a nitro group; a hydroxy group; a carboxy group (—COOH); an alkylcarboxylate group having 1 to 20 carbon atoms; a cycloalkylcarboxylate group having 4 to 20 carbon atoms; an aryl carboxylate group having 6 to 20 carbon atoms; an ether group; an ester group; an imide; an amide group; a substituted or unsubstituted alkyl group having 1 to 20 carbon atoms; a substituted or unsubstituted cycloalkyl group having 4 to 20 carbon atoms; a substituted or unsubstituted alkoxy group having 1 to 20 carbon atoms; a substituted or unsubstituted aryloxy group having 6 to 20 carbon atoms; a substituted or unsubstituted alkylthioxy group having 1 to 20 carbon atoms; a substituted or unsubstituted arylthioxy group having 6 to 20 carbon atoms; a substituted or unsubstituted alkylsulfoxy group having 1 to 20 carbon atoms; a substituted or unsubstituted arylsulfoxy group having 6 to 20 carbon atoms; a substituted or unsubstituted alkenyl group having 2 to 20 carbon atoms; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group having 6 to 20 carbon atoms; or a substituted or unsubstituted heteroaryl group having 5 to 20 carbon atoms, $R_3$, $R_4$, $R_5$ and $R_6$ are the same as or different from each other, and each is hydrogen; an alkyl group having 1 to 20 carbon atoms; a halogen group; a nitrile group; a substituted or unsubstituted alkoxy group having 1 to 20 carbon atoms; a substituted or unsubstituted aryloxy group having 6 to 20 carbon atoms; or a substituted or unsubstituted aryl group having 6 to 20 carbon atoms, the $R_3$ and $R_4$ may be connected to each other to form a substituted or unsubstituted alicyclic ring having 4 to 20 carbon atoms or a substituted or unsubstituted aromatic ring having 6 to 20 carbon atoms, the $R_5$ and $R_6$ may be connected to each other to form a substituted or unsubstituted alicyclic ring having 4 to 20 carbon atoms or a substituted or unsubstituted aromatic ring having 6 to 20 carbon atoms, $Ar_1$ is an aromatic divalent functional group having 6 to 30 carbon atoms, and $Y_1$ is a functional group containing a carboxyl group (COOH), an ether group (—O—), or an ester (—COO—).

The present inventors have newly synthesized the compound of Chemical Formula 1 above, and have found through experiments that as the compound of Chemical Formula 1 has the above-described novel structure, it can have a high fluorescence efficiency or an excellent light resistance, or achieve improved luminance and color reproduction rate, or realize high refractive index modulation in a holographic medium, thereby completing the present invention.

More specifically, the compound of Chemical Formula 1 can be used as a dye in a photopolymer composition that provides a holographic recording medium.

In Chemical Formula 1, the descriptions of each functional group are the same as those described above.

In more specific examples of the functional group of Chemical Formula 1 above, the $X_1$ and $X_2$ may be hydrogen; an alkyl group having 1 to 20 carbon atoms; a halogen group; or a substituted or unsubstituted alkoxy group having 1 to 20 carbon atoms, the $R_1$ and $R_2$ may be each independently a carboxyl group (—COOH); an alkylcarboxylate group having 1 to 20 carbon atoms; a cycloalkyl carboxylate group having 4 to 20 carbon atoms; or an aryl carboxylate group having 6 to 20 carbon atoms, the $R_3$ and $R_4$ may be connected to each other to form a substituted or unsubstituted alicyclic monocyclic or polycyclic ring having 4 to 20 carbon atoms, or a substituted or unsubstituted aromatic monocyclic or polycyclic ring having 6 to 20 carbon atoms, the $R_5$ and $R_6$ may be connected to each other to form a substituted or unsubstituted alicyclic monocyclic or polycyclic ring having 4 to 20 carbon atoms, or a substituted or unsubstituted aromatic monocyclic or polycyclic ring having 6 to 20 carbon atoms, the $Ar_1$ is an aromatic divalent functional group having 6 to 20 carbon atoms, and the $Y_1$ may be a functional group of the following Chemical Formula 2.

Chemical Formula 2

—$Y_2$—$Ar_2$ wherein, in Chemical Formula 2, $Y_2$ may be an ether group or an ester group, and $Ar_2$ may be an aliphatic functional group having 1 to 20 carbon atoms or an aromatic functional group having 6 to 20 carbon atoms in which one or more halogen groups are substituted.

More specific examples of the compound of the Chemical Formula 1 include compounds of the following Chemical Formulas 3 to 5 or mixtures thereof.

[Chemical Formula 3]

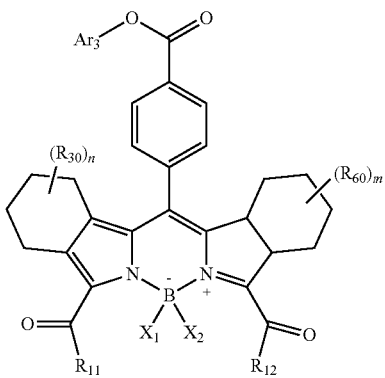

[Chemical Formula 4]

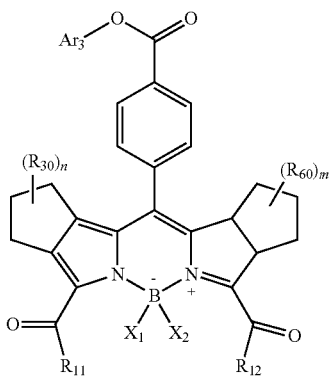

[Chemical Formula 5]

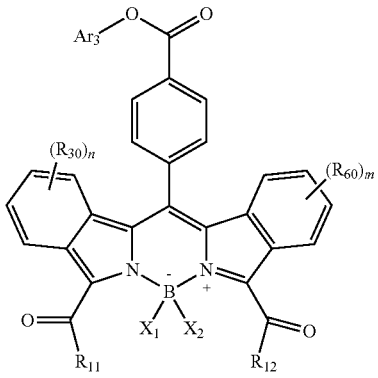

wherein, in Chemical Formulas 3 to 5, $R_{11}$ and $R_{12}$ are each independently hydrogen, a linear or branched alkyl group having 1 to 10 carbon atoms, or a linear or branched alkenyl group having 2 to 20 carbon atoms, $X_1$ and $X_2$ are a halogen group; or a substituted or unsubstituted alkoxy group having 1 to 20 carbon atoms, $R_{30}$ and $R_{60}$ are each independently a halogen group; or a linear or branched alkyl group having 1 to 10 carbon atoms, the m and n are numbers in which $R_{30}$ and $R_{60}$ are substituted with an aromatic ring or an aliphatic ring, which are 1 to 4 in Chemical Formulae 3 and 5, and 1 to 3 in Chemical Formula 4, and $Ar_3$ is an aromatic ring having 6 to 20 carbon atoms in which one or more halogen groups are substituted.

Meanwhile, according to another embodiment of the invention, there may be provided a photopolymer composition including a polymer matrix or a precursor thereof; a dye including the compound of Chemical Formula 1; a photoreactive monomer; and a photoinitiator.

As described above, the present inventors have newly synthesized the compound of Chemical Formula 1 above, and have found through experiments that when such a compound of Chemical Formula 1 is used as a dye in a photopolymer composition that provides a hologram recording medium, it can realize high refractive index modulation values and high diffraction efficiencies even in a thin thickness range, thereby completing the present invention.

Generally, in photopolymer compositions that provide a hologram recording medium, there is known a method in which a certain change may be imparted to a polymer matrix or a recording monomer used for increasing the refractive index modulation value and the diffraction efficiency, or a specific additive may be used, etc. However, the compound of Chemical Formula 1 described above can more easily improve the refractive index modulation value and the diffraction efficiency even if the amount of use is not so high.

The compound of Chemical Formula 1 is the same as those described above.

Meanwhile, the polymer matrix or a precursor thereof can serve as a support for the hologram recording medium and the final product produced therefrom, and the photoreactive monomer can serve as a recording monomer. Depending on the use thereof, the photoreactive monomer may be selectively polymerized on the polymer matrix during holographic recording, and the refractive index modulation occurs due to portions having different refractive indexes.

The polymer matrix or a precursor thereof is a compound which can be commonly used in a photopolymer composition for providing a hologram recording medium and can be used without particular limitation.

Specific examples of the polymer matrix or a precursor thereof include 1) a reaction product between a compound containing one or more isocyanate groups and a polyol; or 2) a polymer matrix including a (meth)acrylate-based (co)polymer in which a silane-based functional group is located in a branched chain, and a silane crosslinking agent.

The hologram formed from a photopolymer composition including a polymer matrix containing a (meth)acrylate-based (co)polymer in which the silane-based functional group is located in a branched chain and a silane crosslinking agent, or a precursor thereof, can realize significantly improved refractive index modulation values and excellent durability against temperature and humidity, compared with previously known holograms, even in a smaller thickness range.

As the silane-based crosslinking agent and the polymer matrix containing a (meth)acrylate-based (co)polymer in which the silane-based functional group is located in a branched chain and a silane crosslinking agent, or a precursor thereof are used, the crosslinking density is optimized when producing the coating film or the hologram from the photopolymer composition, and excellent durability against temperature and humidity can be secured as compared with the existing matrix. In addition, by optimizing the crosslink density as described above, the mobility between the photoreactive monomer having a high refractive index and the component having a low refractive index is increased, and thereby the refractive index modulation can be maximized and the recording characteristics can be improved.

In particular, a crosslinked structure mediated by a siloxane bond can be easily introduced through a sol-gel reaction between a modified (meth)acrylate-based (co)polymer containing a silane-based functional group and a silane crosslinking agent containing a terminal silane-based functional group, and excellent durability against temperature and humidity can be secured through this siloxane bond.

On the polymer matrix, the (meth)acrylate-based (co)polymer in which the silane-based functional groups are located in a branched chain and the silane crosslinking agent may be present as separate components, and they may also be presented in the form of complexes which are formed by reaction with each other.

In the above (meth)acrylate-based (co)polymer, the silane-based functional group can be located in a branched chain. The silane-based functional group may include a silane functional group or an alkoxysilane functional group, and preferably a trimethoxysilane group may be used as an alkoxysilane functional group.

The silane-based functional group may form a siloxane bond through a sol-gel reaction with the silane-based functional group contained in the silane crosslinking agent to crosslink the (meth)acrylate-based (co)polymer and the silane crosslinking agent.

The silane crosslinking agent may be a compound having an average of at least one silane-based functional group per molecule or a mixture thereof, or it may be a compound containing one or more silane-based functional groups. The silane-based functional group may include a silane functional group or an alkoxysilane functional group, and a triethoxysilane group can be preferably used as the alkoxysilane functional group. The silane-based functional group forms a siloxane bond through a sol-gel reaction with the silane-based functional group contained in the (meth)acrylate-based (co)polymer to crosslink the (meth)acrylate-based (co)polymer and the silane crosslinking agent.

At this time, the silane crosslinking agent may have an equivalence of the silane-based functional groups of 200 g/piece to 1000 g/piece. Thereby, the crosslinking density between the (meth)acrylate-based (co)polymer and the silane crosslinking agent is optimized, and thus excellent durability against temperature and humidity can be secured compared to the existing matrix. In addition, by optimizing the crosslink density as described above, the mobility between the photoreactive monomer having a high refractive index and the component having a low refractive index is increased, and thereby the refractive index modulation can be maximized and the recording characteristics can be improved.

If the equivalent of the silane-based functional group contained in the silane crosslinking agent is excessively increased to 1000 g/piece or more, the interface of the diffraction grating after recording can be collapsed due to the reduction in the crosslink density of the matrix. Due to the loose crosslink density and the low glass transition temperature, the monomer and plasticizer components can be eluted to the surface to generate haze. When the equivalent of the silane functional group contained in the silane crosslinking agent is excessively reduced to less than 200 g/piece, the crosslink density is too high, which impedes the flow of the monomer and plasticizer components, whereby the problem that the recording characteristics become extremely low can occur.

More specifically, the silane crosslinking agent is a linear polyether main chain having a weight average molecular weight of 100 to 2000, or 300 to 1000, or 300 to 700, and a silane-based functional group bonded at a terminal end or a branched chain of the main chain.

The linear polyether main chain having a weight average molecular weight of 100 to 2000 may include the repeating unit represented by the following Chemical Formula 3.

Chemical Formula 3

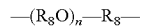

wherein, in Chemical Formula 3, $R_8$ is an alkylene group having 1 to 10 carbon atoms, and n is an integer of 1 or more, or 1 to 50, or 5 to 20, or 8 to 10.

The introduction of a flexible polyether polyol as a main chain can improve the flowability of the components through adjustments of the glass transition temperature and the crosslinking density of the matrix.

Meanwhile, the bond between the silane-based functional group and the polyether main chain can be formed via a urethane bond. Specifically, the silane-based functional group and the polyether main chain may form a mutual bond through a urethane bond. More specifically, the silicon atom contained in the silane-based functional group is bonded directly to the nitrogen atom of the urethane bond or via an alkylene group having 1 to 10 carbon atoms, and the functional group of R8 contained in the polyether main chain can be directly bonded to an oxygen atom of the urethane bond.

As described above, the reason why the silane-based functional group and the polyether main chain are bonded via a urethane bond is that the silane crosslinking agent is a reaction product produced through reaction between an isocyanate compound containing a silane-based functional group and a linear polyether polyol compound having a weight average molecular weight of 100 to 2000.

More specifically, the isocyanate compound may include an aliphatic, cycloaliphatic, aromatic or aromatic aliphatic mono-isocyanate di-isocyanate, tri-isocyanate or poly-isocyanate; or an oligo-isocyanate or a poly-isocyanate of di- or tri-isocyanate having urethane, urea, carbodiimide, acyl urea, isocyanurate, allophanate, buret, oxadiazinetrione, uretdione or iminooxadiazine dione structures.

Further, specific examples of the isocyanate compound containing the silane-based functional group may be 3-isocyanatopropyltriethoxysilane.

Further, the polyether polyols are, for example, the polyaddition products of styrene oxides, of ethylene oxide, propylene oxide, tetrahydrofuran, butylene oxide, epichlorohydrin and their mixed adducts and graft products, and the polyether polyols obtained by condensation of polyhydric alcohols or mixtures thereof and those obtained by alkoxylation of polyhydric alcohols, amines and amino alcohols.

Specific examples of the polyether polyols are poly(propylene oxides), poly(ethylene oxides) and combinations thereof in the form of random or block copolymers or poly(tetrahydrofurans) and mixtures thereof having an OH functionality of 1.5 to 6 and a number average molecular weight between 200 and 18000 g/mol, preferably having an OH functionality of 1.8 to 4.0 and a number average molecular weight of 600 to 8000 g/mol and particularly preferably having an OH functionality of 1.9 to 3.1 and a number average molecular weight of 650 to 4500 g/mol.

Thus, when the silane-based functional group and the polyether main chain are bonded via a urethane bond, a silane crosslinking agent can be more easily synthesized.

The weight average molecular weight (measured by GPC) of the silane crosslinking agent may be 1000 to 5,000,000. The weight average molecular weight refers to a weight average molecular weight (unit: g/mol) in terms of polystyrene measured by GPC method. In the process of measuring the weight average molecular weight in terms of polystyrene measured by GPC method, a detector and an analytical column, such as a commonly known analysis apparatus and differential refractive index detector can be used, and commonly applied temperature conditions, solvent, and flow rate can be used. Specific examples of the measurement conditions may include a temperature of 30° C., chloroform solvent and a flow rate of 1 mL/min.

Meanwhile, the (meth)acrylate-based (co)polymer may include a (meth)acrylate repeating unit and a (meth)acrylate repeating unit in which a silane-based functional group is located in a branched chain.

Examples of the (meth)acrylate repeating unit and a (meth)acrylate repeating unit in which a silane-based functional group is located in a branched chain may include a repeating unit represented by the following Chemical Formula 1.

[Chemical Formula 1]

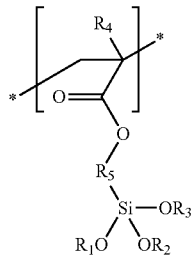

wherein, in Chemical Formula 1, $R_1$ to $R_3$ are each independently an alkyl group having 1 to 10 carbon atoms, $R_4$ is hydrogen or an alkyl group having 1 to 10 carbon atoms, and $R_5$ is an alkylene group having 1 to 10 carbon atoms.

Preferably, in Chemical Formula 1, $R_1$ to $R_3$ are each independently a methyl group having 1 carbon atom, $R_4$ is a methyl group having 1 carbon atom, $R_5$ is a repeating unit derived from 3-methacryloxypropyltrimethoxysilane (KBM-503) which is a propylene group having 3 carbon atoms, or $R_1$ to $R_3$ are each independently a methyl group having 1 carbon atom, $R_4$ is hydrogen, and $R_5$ may be a repeating unit derived from 3-acryloxypropyltrimethoxysilane (KBM-5103) which is a propylene group having 3 carbon atoms.

Further, examples of the (meth)acrylate repeating unit may be a repeating unit represented by the following Chemical Formula 2.

[Chemical Formula 2]

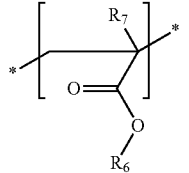

wherein, in Chemical Formula 2, $R_6$ is an alkyl group having 1 to 20 carbon atoms, and $R_7$ is hydrogen or an alkyl group having 1 to 10 carbon atoms, preferably, in Chemical Formula 2, $R_6$ is a butyl group having 4 carbon atoms, and $R_7$ is hydrogen.

The molar ratio between the repeating unit of Chemical Formula 2 and the repeating unit of Chemical Formula 1 may be 0.5:1 to 14:1. If the molar ratio of repeating units of Chemical Formula 1 is excessively reduced, the crosslinking density of the matrix becomes too low to serve as a support, resulting in a decrease in recording characteristics after recording. If the molar ratio of the repeating units of Chemical Formula 1 is excessively increased, the crosslinking density of the matrix becomes too high, and the flowability of the respective components is deteriorated, resulting in a decrease in the refractive index modulation value.

The weight average molecular weight (measured by GPC) of the (meth)acrylate-based (co)polymer may be 100,000 to 5,000,000, or 300,000 to 900,000. The weight average molecular weight refers to a weight average molecular weight (unit: g/mol) in terms of polystyrene measured by GPC method. In the process of measuring the weight average molecular weight in terms of polystyrene measured by GPC method, a detector and an analytical column, such as a commonly known analysis apparatus and differential refractive index detector can be used, and commonly applied temperature conditions, solvent, and flow rate can be used. Specific examples of the measurement conditions may include a temperature of 30° C., chloroform solvent and a flow rate of 1 mL/min.

Meanwhile, in the (meth)acrylate-based (co)polymer, the equivalent of the silane-based functional group may be 300 g/piece to 2000 g/piece, or 500 g/piece to 2000 g/piece, or 550 g/piece to 1800 g/piece, or 580 g/piece to 1600 g/piece, or 586 g/piece to 1562 g/piece. The equivalent means an average value of the molecular weight between the silane functional groups. The smaller the equivalent value, the higher the density of the functional group, and the larger the equivalent value, the smaller the density of the functional group.

As a result, the crosslink density between the (meth)acrylate (co)polymer and the silane crosslinker is optimized, and excellent durability against temperature and humidity can be secured as compared with the existing matrix. In addition, by optimizing the crosslink density as described above, the mobility between the photoreactive monomer having a high refractive index and the component having a low refractive index is increased, and thereby the refractive index modulation can be maximized and the recording characteristics can be improved.

When the equivalent of the silane-based functional group contained in the (meth)acrylate-based (co)polymer is excessively reduced to less than 300 g/piece, the crosslink density of the matrix becomes too high and the flowability of the components is inhibited, thereby causing a reduction of the recording characteristics. Further, if the equivalent of the silane-based functional group contained in the (meth)acrylate-based (co)polymer is excessively increased to more than 2000 g/piece, the crosslinking density is too low to serve as a support, the interface of the diffraction grating generated after recording is collapsed, and the refractive index modulation value can be decreased with the lapse of time.

Meanwhile, the silane crosslinking agent may be contained in an amount of 10 to 90 parts by weight, or 20 to 70 parts by weight, or 22 to 65 parts by weight based on 100 parts by weight of the (meth)acrylate-based (co)polymer.

When the content of the silane crosslinking agent in the reaction product is excessively reduced relative to 100 parts by weight of the (meth)acrylate-based (co)polymer, the curing speed of the matrix is significantly slowed, the function as a support is lost, the interface of the diffraction grating after recording may be easily collapsed. When the content of the silane crosslinking agent in the reaction product is excessively increased relative to 100 parts by weight of the (meth)acrylate-based (co)polymer, the curing speed of the matrix may be increased, but compatibility problems with other components occur due to an excessive increase in the reactive silane group content, and thus, haze occurs.

Further, the modulus (storage elastic modulus) of the reaction product may be 0.01 MPa to 5 MPa. As a specific example of the modulus measurement method, the value of storage modulus (G') may be measured at a room temperature (20° C. to 25° C.) at a frequency of 1 Hz using a discovery hybrid rheometer (DHR) from TA Instruments.

Further, the glass transition temperature of the reaction product may be −40° C. to 10° C. A specific example of the glass transition temperature may be a method of measuring the phase angle (loss modulus) change of the film coated with the photopolymerizable composition in the range of −80° C. to 30° C. under the setting conditions of strain of 0.1%, frequency of 1 Hz, temperature raising rate pf 5° C./min using a dynamic mechanical analysis (DMA).

Another example of the polymer matrix or its precursor may be a polymer matrix including the reaction product between a compound containing at least one isocyanate group and a polyol.

The compound containing at least one isocyanate group may be a known compound having an average of at least one NCO functional group per molecule or a mixture thereof, and may be a compound containing at least one isocyanate group.

More specifically, the compound containing at least one isocyanate group is an aliphatic, cycloaliphatic, aromatic or aromatic aliphatic mono-isocyanate di-isocyanate, tri-isocyanate or poly-isocyanate. In addition, the relatively high molecular weight secondary products (oligo- and polyisocyanates) of monomeric di- and/or triisocyanates having a urethane, urea, carbodiimide, acylurea, isocyanurate, allophanate, biuret, oxadiazinetrione, uretdione or iminooxadiazinedione structure.

Specific examples of the compound containing at least one isocyanate group include butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate and/or 4,4',4"-triisocyanate and the like.

The polyol which reacts with the compound containing at least one isocyanate group to form a polymer matrix may be aliphatic, araliphatic or cycloaliphatic diols, triols and/or higher polyols, i.e. containing 2 to 20 carbon atoms.

The polyol may have a hydroxyl equivalent weight of 300 g/mol to 10,000 g/mol and a weight average molecular weight of 100,000 to 1,500,0000 g/mol.

Examples of diols are ethylene glycol, diethylene glycol, triethylene glycol, tetraethylene glycol, dipropylene glycol, tripropylene glycol, 1,2-propanediol, 1,3-propanediol, 1,4-butanediol, neopentylglycol, 2-ethyl-2-butylpropanediol, trimethylpentanediol, diethyloctanediol positional isomers, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl) propane), 2,2-dimethyl-3-hydroxypropyl dimethyl-3-hydroxypropionate.

Further, examples of the triols are trimethylolethane, trimethylolpropane or glycerol. Suitable higher-functional alcohols are ditrimethylolpropane, pentaerythritol, dipentaerythritol or sorbitol.

Further, as the polyol, relatively high molecular weight aliphatic and cycloaliphatic polyols, such as polyester polyols, polyether polyols, polycarbonate polyols, hydroxy-functional acrylic resins, hydroxy-functional polyurethanes, hydroxy-functional epoxy resins or the like may be used.

The polyesterpolyols are linear polyester diols, as can be prepared in a known manner from aliphatic, cycloaliphatic or aromatic di- or polycarboxylic acids or their anhydrides, such as, for example, succinic, glutaric, adipic, pimelic, suberic, azelaic, sebacic nonanedicarboxylic, decanedicarboxylic, terephthalic, isophthalic, o-phthalic, tetrahydrophthalic, hexahydrophthalic or trimellitic acid, and acid anhydrides, such as o-phthalic, trimellitic or succinic anhydride, or a mixture thereof with polyhydric alcohols, such as, for example, ethanediol, di-, tri- or tetraethylene glycol, 1,2-propanediol, di-, tri-, or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof, optionally with concomitant use of higher functional polyols, such as trimethylolpropane or glycerol. Of course, cycloaliphatic and/or aromatic di- and polyhydroxy compounds are also suitable as polyhydric alcohols for the preparation of the polyester polyols. Instead of the free polycarboxylic acid, it is also possible to use the corresponding polycarboxylic anhydrides or corresponding polycarboxylates of lower alcohols or mixtures thereof for the preparation of the polyesters.

Further, polyester polyols which can be used for the synthesis of the polymer matrix may be homo- or copolymers of lactones, which are preferably obtained by an addition reaction of lactones or lactone mixtures, such as butyrolactone, ε-caprolactone and/or methyl-ε-caprolactone, with suitable difunctional and/or higher-functional initiator molecules, such as, for example, the low molecular weight polyhydric alcohols mentioned above as synthesis components for polyester polyols.

Further, polycarbonates having hydroxyl groups are also suitable as a polyhydroxy component for the prepolymer synthesis, for example those which can be prepared by reaction of diols, such as 1,4-butanediol and/or 1,6-hexanediol and/or 3-methylpentanediol, with diaryl carbonates, e.g., diphenyl carbonate, dimethyl carbonate or phosgene.

Further, polyether polyols that can be used for the synthesis of the polymer matrix include, for example, the polyaddition products of styrene oxides, of ethylene oxide, propylene oxide, tetrahydrofuran, butylene oxide, epichlorohydrin and their mixed adducts and graft products, and the polyether polyols obtained by condensation of polyhydric alcohols or mixtures thereof and those obtained by alkoxylation of polyhydric alcohols, amines and amino alcohols. Specific examples of the polyether polyols are poly(propylene oxides), poly(ethylene oxides) and combinations thereof in the form of random or block copolymers or poly(tetrahydrofurans) and mixtures thereof having an OH functionality of 1.5 to 6 and a number average molecular weight between 200 and 18000 g/mol, preferably having an OH functionality of 1.8 to 4.0 and a number average molecular weight of 600 to 8000 g/mol and particularly preferably having an OH functionality of 1.9 to 3.1 and a number average molecular weight of 650 to 4500 g/mol.

Meanwhile, the photoreactive monomer may include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer binder is present in relatively large amounts, the refractive index becomes relatively low, the refractive index modulation occurs, and a diffraction grating is generated by such refractive index modulation.

Specifically, one example of the photoreactive monomer may include (meth)arcylate-based α,β-unsaturated carboxylic derivative, for example, (meth)acrylate, (meth)acrylamide, (meth)acrylonitrile, (meth)acrylic acid or the like, or a compound containing a vinyl group or a thiol group.

One example of the photoreactive monomer may include a polyfunctional (meth)acrylate monomer having a refractive index of 1.5 or more, 1.53 or more, or 1.5 to 1.7. The polyfunctional (meth)acrylate monomer having a refractive index of 1.5 or more, or 1.53 or more, or 1.5 to 1.7 may include a halogen atom (bromine, iodine, etc.), sulfur (S), phosphorus (P), or aromatic ring.

More specific examples of the photoreactive monomer include a polyfunctional (meth)acrylate monomer having a refractive index of 1.5 or more include bisphenol A modified diacrylate type, fluorene acrylate type (HR6022, etc.— Miwon Specialty Chemical), bisphenol fluorene epoxy acrylate type (HR6100, HR6060, HR6042, etc.—Miwon), halogenated epoxy acrylate series (HR1139, HR3362, etc.— Miwon).

Another example of the photoreactive monomer may include a monofunctional (meth)acrylate monomer. The monofunctional (meth)acrylate monomer may contain an ether bond and a fluorene functional group in the molecule. Specific examples of such monofunctional (meth)acrylate monomer include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

Meanwhile, the photoreactive monomer may have a weight average molecular weight of 50 g/mol to 1000 g/mol, or 200 g/mol to 600 g/mol. The weight average molecular weight refers to a weight average molecular weight in terms of polystyrene measured by GPC method.

Meanwhile, the hologram recording medium of the embodiment includes a photoinitiator. The photoinitiator is a compound which is activated by light or actinic radiation and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator, or a photoanionic polymerization initiator.

Specific examples of the photoradical polymerization initiator include imidazole derivatives, bisimidazole derivatives, N-aryl glycine derivatives, organic azide compounds, titanocene, aluminate complex, organic peroxide, N-alkoxypyridinium salts, thioxanthone derivatives, amine derivatives or the like. More specifically, examples of the photoradical polymerization initiator include 3-di(t-butyldioxycarbonyl)benzophenone, 3,3',4,4"-tetrakis(t-butyldioxycarbonyl) benzophenone, 3-phenyl-5-isoxazolone, 2-mercapto benzimidazole, bis(2,4,5-triphenyl)imidazole, 2,2-dimethoxy- 1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), and bis(η5-2,4-cyclopentadiene -1-yl)-bis(2,6-difluoro-3-(1H-pyrrole-1-yl)-phenyl)titanium (product name: Irgacure 784/manufacturer: BASF), Ebecryl P-115(manufacturer: SK entis).

The photocationic polymerization initiator may include a diazonium salt, a sulfonium salt, or an iodonium saltm, and examples thereof include sulfonic acid esters, imidosulfonates, dialkyl-4-hydroxysulfonium salts, arylsulfonic acid-p-nitrobenzyl esters, silanol-aluminum complexes, (η6-benzene) (η5-cyclopentadienyl)iron (II), or the like. In addition, benzoin tosylate, 2,5-dinitrobenzyltosylate, N-tosylphthalic acid imide, or the like can be mentioned. More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: BASF) or CIT-1682 (manufacturer: Nippon Soda).

The photoanionic polymerization initiator may be borate salt, for example, butyryl chlorine butyl triphenyl borate, or the like. More specific examples of the photoanionic polymerization initiator include commercially available products such as Borate V (manufacturer: Spectra Group).

In addition, the photopolymer composition of the embodiment may include monomolecular (type I) initiator or bimolecular (type II) initiator. The (type I) system for free radical photopolymerization may include, for example, an aromatic ketone compounds in combination with a tertiary amine, such as benzophenone, alkylbenzophenone, 4,4'-bis (dimethylamino)benzophenone (Michler's ketone), anthrone and halogenated benzophenone or a mixture of these types. The bimolecular (type II) initiator may include benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha-dialkoxyacetophenone, 1-[4-(phenylthio) phenyl] loctane-1,2-dione 2-(O-benzoyloxime), alpha-hydroxyalkylphenone, and the like.

The photopolymer composition of the embodiment may include 1% to 80% by weight of the polymer matrix or a precursor thereof; 1% to 80% by weight of the photoreactive monomer; 0.0001% to 10% by weight of the dye; and 0.1% to 20% by weight of the photoinitiator. When the photopolymer composition further includes an organic solvent as described hereinafter, the content of the above-mentioned components is based on the sum of the above-mentioned components (the sum of the components excluding the organic solvent).

Meanwhile, the hologram recording medium may further include at least one selected from the group consisting of a catalyst, a phosphate-based compound, and a low refractive index fluorine-based compound.

The phosphate-based compound and the low refractive index fluorine-based compound have a lower refractive index than the photoreactive monomer, and thus, the refractive index of the polymer matrix is lowered and the refractive index modulation of the photopolymer composition can be maximized. Furthermore, the phosphate-based compound can act as a plasticizer to lower the glass transition temperature of the polymer matrix, to increase the mobility of the photoreactive monomer and the low refractive components, and to contribute to the improvement of the formability of the photopolymer composition.

More specifically, the low refractive index fluorine-based compound has stability with little reactivity and has low refractive properties. Thus, when added to the photopolymer composition, the refractive index of the polymer matrix can be more lowered, and the refractive index modulation with the monomer can be maximized.

The fluorine-based compound may include at least one functional group selected from the group consisting of an ether group, an ester group and an amide group, and at least two difluoromethylene groups. The fluorine-based compound may include a structure of the following Chemical Formula 4 in which functional groups including ether groups are bonded to both terminal ends of the central functional group including a direct bond or an ether bond between two difluoromethylene groups.

[Chemical Formula 4]

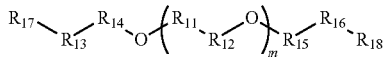

wherein, in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a polyalkylene oxide group, m is an integer of 1 or more, or an integer of 1 to 10, or an integer of 1 to 3;

Preferably, in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently 2-methoxyethoxymethoxy group, and m is an integer of 2.

The fluorine-based compound may have a refractive index of less than 1.45, or more than 1.3 and less than 1.45. As described above, since the photoreactive monomer has a refractive index of 1.5 or more, the fluorine-based compound can more reduce the refractive index of the polymer matrix through the refractive index than that of the photoreactive monomer, thereby maximizing the refractive index modulation with the monomer.

Specifically, the content of the fluorine-based compound may be 30 parts by weight to 150 parts by weight, or 50 parts by weight to 110 parts by weight, based on 100 parts by weight of the photoreactive monomer.

When the content of the fluorine-based compound is excessively reduced relative to 100 parts by weight of the photoreactive monomer, the refractive index modulation value after recording is lowered due to the lack of low refractive index components. When the content of the fluorine-based compound is excessively increased relative to 100 parts by weight of the photoreactive monomer, a haze may be generated due to the compatibility problem with other components, or the problem of elution of some fluorine-based compounds on the surface of the coating layer can occur.

The fluorine-based compound may have a weight average molecular weight (measured by GPC) of 300 or more, or 300 to 1000. A specific method of measuring the weight average molecular weight is as described above.

Meanwhile, specific examples of the phosphate-based compound include triphenyl phosphate, tricresyl phosphate, cresyldiphenyl phosphate, octyldiphenyl phosphate, diphenyl biphenyl phosphate, trioctyl phosphate, tributyl phosphate and the like.

The phosphate-based compound may be added together with the above-mentioned fluorine-based compound at a weight ratio of 1:5 to 5:1. The phosphate-based compound may have a refractive index of less than 1.5 and a molecular weight of 700 or less.

The photopolymer composition may further include other additives, a catalyst, and the like. For example, the photopolymer composition may include a catalyst commonly known for promoting polymerization of the polymer matrix or photoreactive monomer. Examples of the catalyst include tin octanoate, zinc octanoate, dibutyltin dilaurate, dimethylbis[(1-oxyneodecyl)oxy]stannane, dimethyl tin dicarboxylate, zirconium bis(ethylhexanoate), zirconium acetylacetonate, p-toluenesulfonic acid or tertiary amines, for example, 1,4-diazabicyclo[2.2.2]octane, diazabicyclononane, diazabicyclo dodecane, 1,1,3,3-tetramethylguanidine, 1,3,4,6,7,8-hexahydro-1-methyl-2H-pyrimido(1,2-a)pyrimidine, and the like.

Examples of the other additives include a defoaming agent, and as the defoaming agent, a silicone-based reactive additive can be used, and an example thereof is Tego Rad 2500.

Meanwhile, the photopolymer composition of the embodiment may further include a photoreactive dye different from the compound of Chemical Formula 1 described above.

The photosensitizing dye serves as photosensitizing pigment to sensitize the photoinitiator. More specifically, the photosensitizing dye may be stimulated by the light irradiated on the photopolymer composition and may also serve as an initiator to initiate polymerization of the monomer and the crosslinking monomer, Examples of the photosensitizing dyes different from the compound of Chemical Formula 1 are not particularly limited, and various compounds commonly known in the art can be used.

Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue, Quinaldine Red, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

Meanwhile, an organic solvent may be used in the production of the hologram recording medium. Non-limiting examples of the organic solvent include ketones, alcohols, acetates, ethers, and mixtures of two or more thereof.

Specific examples of such organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent may be added at the time of mixing the respective components contained in the photopolymer composition for producing the hologram recording medium, or may be contained in the photopolymer composition while adding the respective components in a state of being dispersed or mixed in an organic solvent. When the content of the organic solvent in the photopolymer composition is too low, the flowability of the photopolymer composition may be lowered, resulting in the occurrence of defects such as the occurrence of striped patterns on the finally produced film. In addition, when the organic solvent is added in an excess amount, the solid content is lowered, and the coating and film formation are not sufficient, so that the physical properties and surface characteristics of the film may be deteriorated and defects may occur during the drying and curing process. Thus, the photopolymer composition may include an organic solvent such that the total solid content concentration of the components contained is 1% to 70% by weight, or 2% to 50% by weight.

Meanwhile, the hologram recording medium can realize a refractive index modulation value (n) of 0.020 or more, 0.021 or more, 0.022 or more, or 0.0225 to 0.035 even at a thickness of 5 µm to 30 µm.

In addition, the hologram recording medium can realize 50% or more, 85% or more, or 85 to 99% of diffraction efficiency at a thickness of 5 µm to 30 µm.

In the photopolymer composition for producing the hologram recording medium, the respective components contained therein are homogeneously mixed, dried and cured at a temperature of 20° C. or higher, and then predetermined exposure procedures were undertaken, thereby producing a hologram for optical application in the entire visible range and the near ultraviolet region (300 to 800 nm).

In the photopolymer composition, the remaining components forming a polymer matrix or the precursor thereof are first homogeneously mixed. Subsequently, the above-described silane crosslinking agent may be mixed with the catalyst to prepare holograms.

In the photopolymer composition, a mixing device, a stirrer, a mixer, or the like which are commonly known in the art can be used for mixing the respective components contained therein without particular limitation. The temperature in the mixing process may be 0° C. to 100° C., preferably 10° C. to 80° C., particularly preferably 20° C. to 60° C.

Meanwhile, the components forming a polymer matrix or the precursor thereof in the photopolymer composition are first homogenized and mixed. Subsequently, it can be a liquid formulation that is cured at a temperature of 20° C. or more. The curing temperature may vary depending on the composition of the photopolymer and the curing is promoted, for example, by heating at a temperature of from 30° C. to 180° C.

At the time of curing, the photopolymer may be in state of being injected into or coated onto a predetermined substrate or mold.

Meanwhile, as the method of recording a visual hologram on a hologram recording medium produced from the photopolymer composition, generally known methods can be used without particular limitation. The method described in the holographic recording method of the embodiment described hereinafter can be adopted as one example.

Meanwhile, according to another embodiment of the invention, there may be provided a holographic recording method which comprises selectively polymerizing photoreactive monomers contained in the photopolymer composition using a coherent laser.

As described above, through the process of mixing and curing the photopolymer composition, it is possible to produce a medium in a form in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

Meanwhile, according to another embodiment of the invention, an optical element including a hologram recording medium can be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

An example of an optical element including the hologram recording medium may include a hologram display device.

The hologram display device includes a light source unit, an input unit, an optical system, and a display unit. The light source unit is a portion that irradiates a laser beam used for providing, recording, and reproducing three-dimensional image information of an object in the input unit and the display unit. Further, the input unit is a portion that previously inputs three-dimensional image information of an object to be recorded on the display unit, and for example, three-dimensional information of an object such as the intensity and phase of light for each space can be inputted into an electrically addressed liquid crystal SLM, wherein an input beam may be used. The optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate comprising an optically addressed SLM, and reproduce the three-dimensional image of the object. In this case, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. Meanwhile, the hologram plate can be moved between a position at which a three-dimensional image is inputted and a position at which a three-dimensional image is reproduced.

Advantageous Effects

According to the present invention, there can be provided a compound having a novel structure, a photopolymer composition capable of providing a hologram recording medium which can realize a large value of refractive index modulation even while having a thin thickness, a hologram recording medium which can realize a large value of refractive index modulation even while having a thin thickness, an optical element including the hologram recording medium, and a holographic recording method using the hologram recording medium.

DETAILED DESCRIPTION OF THE EMBODIMENTS

Hereinafter, the present invention will be described in more detail by way of the following examples. However, these examples are given for illustrative purposes only and are not intended to limit the scope of the present invention thereto.

Preparation Example

Preparation Example 1: Synthesis of Dye Compound (1) Preparation of methyl 4,5,6,7-tetrahydro-2H-isoindole-1-carboxylate (Product 4)

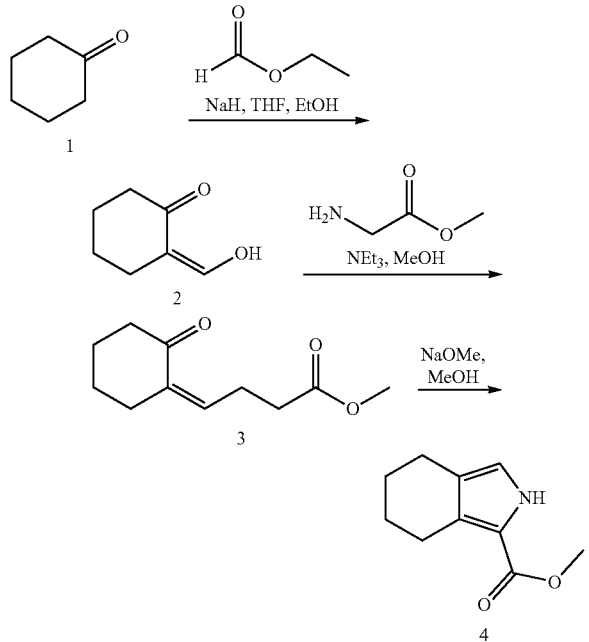

A mixture of sodium hydride (NaH; 60% w/v oil, 4 g, 0.1018 mol), tetrahydrofuran (THF; 500 ml), and ethanol (EtOH, 1 ml) was cooled to 0° C. Ethyl formate (11.3 g, 0.1528 mol) and cyclohexanone (10 g, 0.1018 mol) were added dropwise to the solution, and the reaction mixture was stirred for 6 hours and then kept at room temperature overnight.

Then, 500 ml of water was added and the obtained clear solution was extracted three times with 100 ml of ethyl acetate. The aqueous layer was separated and acidified with concentrated hydrochloric acid (HCl) (pH~1). The product 2 was extracted with ethyl acetate (100 ml×2), and the organic layer was separated, dried over magnesium sulfate (MgSO$_4$) and concentrated in vacuo to give 11.6 g of the product 2 in a yield of 90%.

The product 2 (11.6 g, 0.0920 mol) was dissolved in 150 ml of methanol, and then glycine methyl ester hydrochloride (11.5 g, 0.0920 mol) and triethylamine (12.8 g, 0.0920 mol) were added thereto. The reaction mixture was stirred at room temperature overnight and then concentrated in vacuo.

To the concentrated reaction product was added 300 ml of water and the aqueous solution was extracted with chloroform (200 ml×2). The organic layer was separated, washed with 100 ml of brine, then dried over magnesium sulfate and concentrated to give 15.1 g of the product 3 in a yield of 83%.

After the product 3 (15.1 g, 0.0765 mol) was dissolved in 50 ml of methanol, 30% sodium methylate (NaOMe; 14.2 ml, 0.0765 mol) and 50 ml of methanol were added thereto, and the mixture was allowed to react at 90° C. for 3 hours. After cooling the reaction product to room temperature, the solution was diluted with 300 ml of water and extracted with ethyl acetate (100 ml×3). The organic layer was dried over magnesium sulfate and concentrated in vacuo. The residue was purified by column chromatography (hexane/ethyl acetate=9/1) to give 4.5 g of the product 4 in a yield of 33%.

1H NMR (CDCl$_3$): 8.8 (1H, s, NH), 6.65 (1H, s, Ar), 3.83 (3H, s, CH$_3$), 2.82-2.79 (2H, t, CH$_2$), 2.56-2.53 (2H, t, CH$_2$), 1.79-1.70 (4H, m, 2CH$_2$).

(2) Preparation of 2,4-dibromophenyl 4-formylbenzoate (Produce 6)

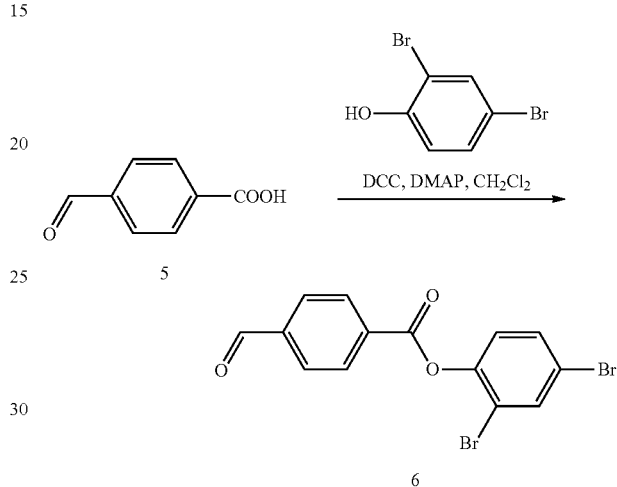

To terephthalaldehydic acid (5) (1 g, 0.0066 mol) dissolved in 20 ml of dichloromethane, DCC (N,N'-dicyclohexylcarbodiimide (1.9 g, 0.0093 mol) and DMAP (4-dimethylaminopyridine (0.08 g, 0.0006 mol) were added at room temperature, and 2,4-dibromophenol (1.6 g, 0.0066 mol) was additionally added and the mixture was allowed to react with stirring overnight at room temperature.

The precipitate was filtered and the filtrate was concentrated in vacuo, then the residue was stirred with 20 ml of ethanol for 30 minutes, then filtered and dried to give 2.2 g of the product 6 in a yield of 88%.

1H NMR (CDCl$_3$): 10.16 (1H, s, CHO), 8.41-8.38 (2H, d, Ar), 8.06-8.03 (2H, d, Ar), 7.83 (1H, s, Ar), 7.55-7.51 (1H, d, Ar), 7.21-7.18 (1H, d, Ar).

(3) Preparation of dimethyl 3,3'-((4-((2,4-dibromophenoxy) carbonyl)phenyl)methylene) bis(4,5,6,7-tetrahydro-2H-isoindole-1-carboxylate) (Produce 7)

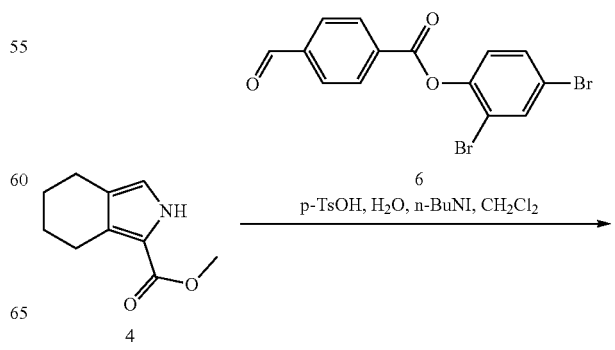

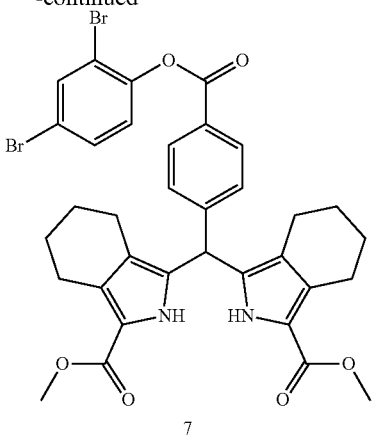

To the synthesized product 4 (1.7 g, 0.0095 mol) dissolved in 30 ml dichloromethane, toluene sulfonic acid monohydride (0.09 g, 0.00047 mol), tetrabutylammonium iodide (0.03 g, 0.00009 mol) and the synthesized product 6 (2.2 g, 0.0057 mol) were added and the mixture was stirred at room temperature under a nitrogen atmosphere overnight.

The mixture was then washed with saturated sodium hydrogen carbonate (50 ml) and brine (50 ml), and then dried over magnesium sulfate. The solvent was removed in vacuo and the residue was recrystallized from ethanol to give product 7 (yield of about 88%/3 g).

(4) Preparation of dimethyl 14-(4-((2,4-dibromophenoxy)carbonyl)phenyl)-7,7-difluoro -1,3,4,7,10,11,12,13-octahydro-2H-6λ4,7λ4-[1,3,2] diazaborinino[4,3-a:6,1-a']diisoindole-5,9-dicarboxylate (Dye of Compound 8)

DDQ (2,3-dichloro-5,6-dicyano-p-benzoquinone, 1.1 g, 0.0049 mol) was added to a solution of the synthesized product 7 (3 g, 0.0041 mol) dissolved in dichloromethane at 0° C., and the mixture was stirred for 20 minutes under a nitrogen atmosphere.

To this mixture was added dropwise trimethylamine (3.4 ml, 0.0246 mol) and BF$_3$OEt$_2$ (5 ml, 0.041 mol) at 0° C., and the reaction mixture was stirred at 0° C. for 20 minutes and then at room temperature overnight. The mixture was then washed with 50 ml saturated sodium bicarbonate and 50 ml of brine and dried over magnesium sulfate. The solvent was removed in vacuo and the residue was purified by column chromatography (hexane/ethyl acetate=2/1) to give the dye of compound 8 (yield of about 70.9%, 2.2 g).

1) 1H NMR (CDCl$_3$): 8.41-8.39 (2H, d, Ar), 7.85 (1H, s, Ar), 7.57-7.53 (1H, d, Ar), 7.49-7.47 (2H, d, Ar), 7.28-7.25 (1H, d, Ar), 3.99 (6H, s, 2CH3), 2.61-2.56 (4H, t, 2CH$_2$), 1.63-1.56 (8H, m, 4CH$_2$), 1.47-1.41 (4H, m, 2CH$_2$).

2) UV-VIS spectrum: λmax=530 nm

The synthesized dye synthesized was diluted to 0.001 wt % in a methyl ethyl ketone (MEK) solvent, and absorbance (%) in a wavelength range from 380 nm to 780 nm was measured by using a UV-Vis spectrophotometer to determine the maximum absorption wavelength.

(5) Preparation of dimethyl 14-(4-((2,4-dibromophenoxy)carbonyl)phenyl)-7,7-difluoro -7H-6λ4,7λ4-[1,3,2]diazaborinino[4,3-a:6,1-a']diisoindole-5,9-dicarboxylate (Dye of Compound 9)

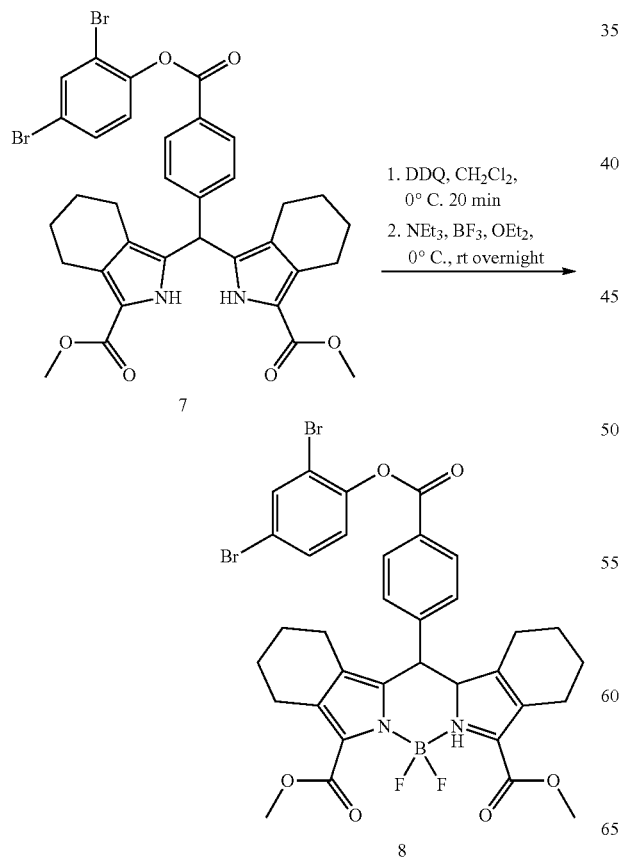

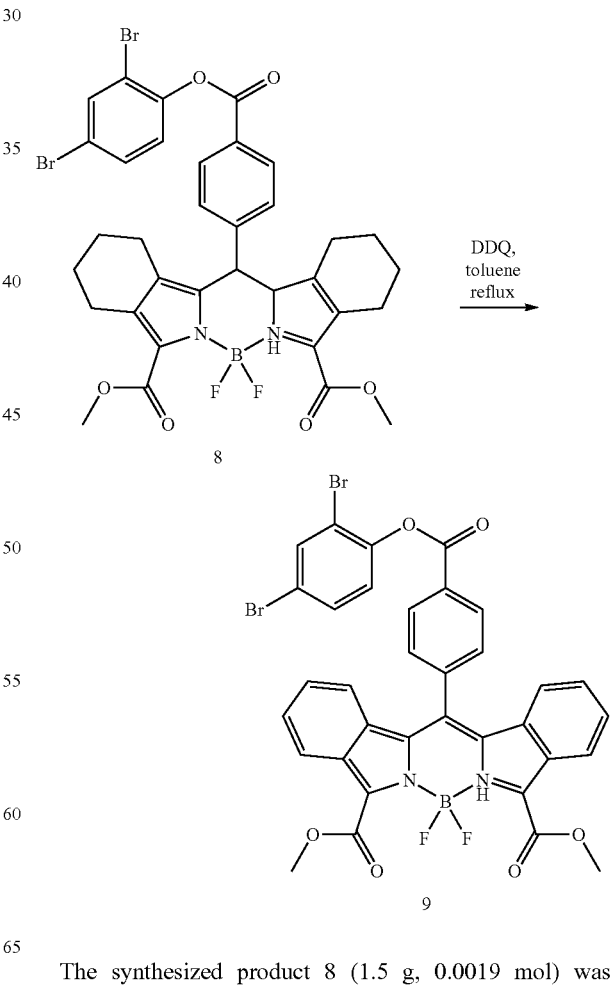

The synthesized product 8 (1.5 g, 0.0019 mol) was dissolved in 100 ml of toluene and the solution was heated to reflux. 100 ml of toluene in which DDQ (2,3-dichloro-5,6-dicyano-p-benzoquinone (3.9 g, 0.0175 mol) was dissolved was added and reflux was continued for 4 hours. The reaction mixture was cooled and the solvent was removed in vacuo. The residue was dissolved in ethyl acetate, and the solution was washed with saturated sodium hydrogencarbonate (100 ml×3) and brine (100 ml) and dried over magnesium sulfate. The solvent was removed in vacuo and the residue was purified by column chromatography (hexane/ethyl acetate=2/1). The product was stirred in 20 ml of methanol for 30 minutes and filtered to give a dye of compound 9 (yield of 65%, 2.1 g).

UV-VIS spectrum: λmax=633 nm

Preparation Example 2: Preparation of Non-Reactive Low Refractive Index Material 20.51 g of 2,2'-((oxybis(1,1,2,2-tetrafluoroethane-2,1-diyl))bis(oxy))bis(2,2-difluoroethan -1-ol) was placed in a 1000 ml flask, and then dissolved in 500 g of tetrahydrofuran and 4.40 g of sodium hydride (60% dispersion in mineral oil) was carefully added several times while stirring at 0° C. for 20 minutes, 12.50 ml of 2-methoxyethoxymethyl chloride was slowly dropped. When it was confirmed that all of the reactants have been consumed by $^1$H NMR, the reaction solvent was removed under reduced pressure. After extraction was performed three times with 300 g of dichloromethane, the organic layer was collected, and filtered with magnesium sulfate, applied to reduced pressure to remove all dichloromethane. Thereby, 29 g of a liquid product having a purity of 95% or more was obtained at a yield of 98%.

Preparation Example 3: Preparation of (meth)Acrylate-Based (Co)Polymer in which Silane Functional-Based Group is Located in a Branched Chain 69.3 g of butyl acrylate and 20.7 g of KBM-503 (3-methacryloxypropyltrimethoxysilane) were placed in a 2 L jacket reactor, and diluted with 700 g of ethyl acetate. The reaction temperature was set at about 70° C. and stirring was performed for about one hour. 0.02 g of n-dodecyl mercaptan was further added and stirring was performed for about 30 minutes. Then, 0.06 g of AIBN, which is a polymerization initiator, was added and polymerization was allowed to proceed for 4 hours or more at the reaction temperature and maintained until the content of the residual acrylate became less than 1%, thereby preparing (meth)acrylate-based (co)polymer (weight average molecular weight: about 900,000, Si—(OR)$_3$ equivalent: 1019 g/piece) in which a silane-based functional group is located on a branched chain.

Preparation Example 4: Preparation of Silane Crosslinking Agent 19.79 g of KBE-9007 (3-isocyanatopropyltriethoxysilane), 12.80 g of PEG-400 and 0.57 g of DBTDL were placed in a 1000 ml flask, and diluted with 300 g of tetrahydrofuran. Stirring was performed at room temperature until being confirmed by TLC that all the reaction material had been consumed, the reaction solvent was all removed under reduced pressure.

28 g of a liquid product having a purity of 95% or more was separated at a yield of 91% through column chromatography under a developing solution of dichloromethane: methyl alcohol=methyl alcohol=30:1 to obtain a silane crosslinking agent.

Examples and Comparative Examples: Preparation of Photopolymer Composition

As shown in Table 1 below, the (meth)acrylate-based (co)polymer of Preparation Example 3 in which the silane-based functional group is located in a branched chain, a photoreactive monomer (high refractive index acrylate, refractive index of 1.600, HR6022 [Niwon Specialty Chemical]), the non-reactive low refractive index material of Preparation Example 2, the dipyrromethene boron complex of Chemical Formula 10, tributyl phosphate [TBP], molecular weight 266.31, refractive index 1.424, manufactured by Sigma-Aldrich), Ethyl Violet and Eosin (dyes, products at Sigma-Aldrich), Ebecryl P-115 (SK entis), Borate V (Spectra Group), Irgacure 250 (Onium salt, BASF) and methyl isobutyl ketone (MIBK) were mixed in a state where light was blocked, and stirred for about 10 minutes with a Paste mixer to obtain a clear coating solution.

The silane crosslinking agent of Preparation Example 4 was added to the coating solution and further stirred for 5 to 10 minutes. Then, DBTDL as a catalyst was added to the coating solution, stirred for about 1 minute, then coated to a thickness of 7 μm on a TAC substrate having a thickness of 80 μm using a Meyer bar and dried at 40° C. for 1 hour.

Experimental Example: Holographic Recording (1) The photopolymer-coated (hologram recoding medium) surfaces prepared in each of Examples and Comparative Examples were laminated on a slide glass, and fixed so that a laser first passed through the glass surface at the time of recording.

(2) Measurement of Diffraction Efficiency (η)

A holographic recording was done via interference of two interference lights (reference light and object light), and the transmission-type recording was done so that the two beams were incident on the same side of the sample. The diffraction efficiencies are changed according to the incident angle of the two beams, and become non-slanted when the incident angles of the two beams are the same. In the non-slanted recording, the diffraction grating is generated vertically to the film because the incident angles of the two beams are the same on the normal basis.

The recording (2θ=45°) was done in a transmission-type non-slanted manner using a laser with a wavelength of 532 nm or a laser with a wavelength of 633 nm, and the diffraction efficiency (η) was calculated according to the following Equation 1.

$$\eta = \frac{P_D}{P_D + P_T} \qquad \text{[Equation 1]}$$

wherein, in Equation 1, η is a diffraction efficiency, $P_D$ is an output amount (mW/cm$^2$) of the diffracted beam of a sample after recording, and $P_T$ is an output amount (mW/cm$^2$) of the transmitted beam of the recorded sample.

(3) Measurement of the refractive index modulation value (n)

The lossless dielectric grating of the transmission-type hologram can calculate the refractive index modulation value (Δn) from the following Equation 2.

$$\eta(DE) = \sin^2\left(\sqrt{v^2}\right) = \sin^2\left(\frac{\pi \Delta n d}{\lambda \cos\theta}\right) \qquad \text{[Equation 2]}$$

wherein, in Equation 2, d is a thickness of the photopolymer layer, (Δn) is a refractive index modulation value, (η)DE) is a diffraction efficiency, and λ is a recording wavelength.

TABLE 1

Measurement Results of Experimental Examples of Photopolymer Compositions of Examples (unit: g) and Holographic Recording Medium Prepared Therefrom

| Category | | Example 1 | Example 2 | Example 3 | Example 4 | Comparative Example 1 | Comparative Example 2 | Comparative Example 3 |
|---|---|---|---|---|---|---|---|---|
| (Meth)acrylate-based copolymer | Preparation Example 3 | 21.5 | 21.5 | 21.5 | 21.5 | 21.5 | 21.5 | 21.5 |
| Linear silane crosslinking agent | Preparation Example 4 | 6.1 | 6.1 | 6.1 | 6.1 | 6.1 | 6.1 | 6.1 |
| Photoreactive monomer | HR6022 | 40.2 | 40.2 | 40.2 | 40.2 | 40.2 | 40.2 | 40.2 |
| Dye | Compound 8 | 0.1 | 0.1 | | | | | |
| | Compound 9 | | | 0.1 | 0.15 | | | |
| | Ethyl Violet (Aldrich) | | | | | 0.1 | | |
| | Eosin (Aldrich) | | | | | | 0.1 | |
| | Compound 10 (Carboxyl group-unintroduced dye) | | | | | | | 0.1 |
| Initiator | Amine (Ebecryl P-115) | | | | | 1.5 | 1.5 | 1.5 |
| | Borate salt (Borate V) | 0.12 | 0.15 | 0.26 | 0.26 | 0.26 | 0.26 | 0.26 |
| | Onium salt (Irgacure 250) | 0.1 | 0.1 | 0.1 | 0.1 | 0.1 | 0.1 | 0.1 |
| Non-reactive low refractive index material | Preparation Example2 | 30 | 30 | 30 | 30 | 30 | 30 | 30 |
| Catalyst | DBTDL(dibutyltin dilaurate) | 0.02 | 0.02 | 0.02 | 0.02 | 0.02 | 0.02 | 0.02 |
| Additive | Tego Rad 2500 | 0.22 | 0.22 | 0.22 | 0.22 | 0.22 | 0.22 | 0.22 |
| Solvent | MIBK | 295 | 295 | 295 | 296 | 300 | 300 | 300 |
| Coating thickness (unit: μm) | | 6.5 | 6.5 | 6.5 | 6.5 | 6.5 | 6.5 | 6.5 |
| Δn | | 0.023 | 0.030 | 0.023 | 0.027 | 0.018 | 0.014 | 0.010 |

*[Chemical Formula 10: dipyrromethane boron complex compound]

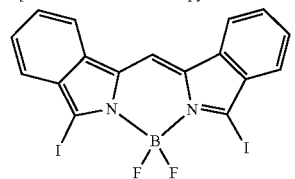

As shown in Table 1 above, it was confirmed that the hologram recording medium of Examples 1 to 4 can realize a refractive index modulation value (Δn) of 0.022 or more at a thickness of 6.5 μm. In contrast, it was confirmed that the hologram recording medium of Comparative Examples 1 and 2 has a relatively low diffraction efficiency as compared with Examples. The diffraction efficiency of the hologram recording medium of Comparative Example 3 using the dipyrromethene boron complex of Chemical Formula 10 in which the carboxyl group was not introduced was found to be extremely low.

The invention claimed is:
1. A compound selected from the group consisting of Chemical Formulae 3 to 5:

[Chemical Formula 3]

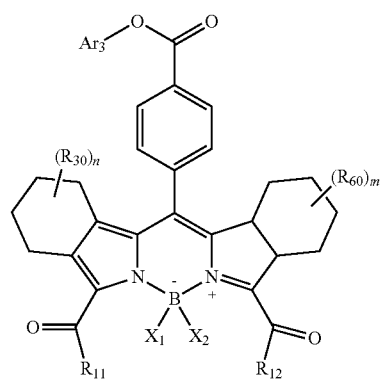

-continued

[Chemical Formula 4]

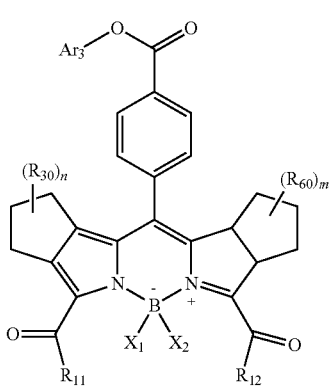

[Chemical Formula 5]

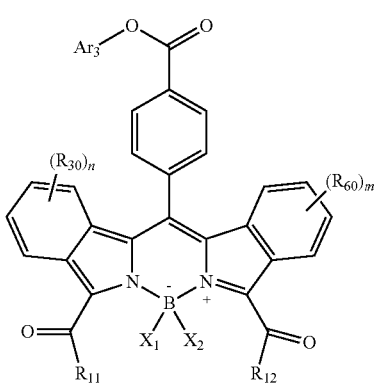

wherein, in the Chemical Formulae 3 to 5, $R_{11}$ and $R_{12}$ are each independently hydrogen, a linear or branched alkyl group having 1 to 10 carbon atoms, or a linear or branched alkenyl group having 2 to 20 carbon atoms, $X_1$ and $X_2$ are each independently a halogen group; or a substituted or unsubstituted alkoxy group having 1 to 20 carbon atoms, $R_{30}$ and $R_{60}$ are each independently a halogen group; or a linear or branched alkyl group having 1 to 10 carbon atoms, m and n are each independently 1 to 4 in the Chemical Formulae 3 and 5, and 1 to 3 in the Chemical Formula 4, and $Ar_3$ is an aromatic ring having 6 to 20 carbon atoms substituted with one or more halogen groups.

2. A photopolymer composition comprising:
a polymer matrix or a precursor thereof;
a dye containing the compound of claim 1;
a photoreactive monomer; and
a photoinitiator.

3. The photopolymer composition according to claim 2, wherein the polymer matrix or a precursor thereof includes 1) a reaction product between a compound containing one or more isocyanate groups and a polyol; or 2) a polymer matrix including a (meth)acrylate-based (co)polymer having a silane-based functional group in a branched chain thereof, and a silane crosslinking agent.

4. The photopolymer composition according to claim 3, wherein the silane crosslinking agent includes a linear polyether main chain having a weight average molecular weight of 100 to 2000, and a silane-based functional group bonded at a terminal end or a branched chain of the main chain.

5. The photopolymer composition according to claim 3, wherein the (meth)acrylate-based (co)polymer having a silane-based functional group in a branched chain,
includes a (meth)acrylate repeating unit and a (meth)acrylate repeating unit having the silane-based functional group in the branched chain, and
has a weight average molecular weight of 100,000 to 1,000,000.

6. The photopolymer composition according to claim 2, wherein the photoreactive monomer includes a polyfunctional (meth)acrylate monomer, or a monofunctional (meth)acrylate monomer.

7. The photopolymer composition according to claim 2, comprising 1% to 80% by weight of the polymer matrix or a precursor thereof; 1% to 80% by weight of the photoreactive monomer; 0.0001% to 10% by weight of the dye; and 0.1% to 20% by weight of the photoinitiator based on the total weight of the photopolymer composition.

8. The photopolymer composition according to claim 2, wherein the photopolymer composition further comprises at least one selected from the group consisting of a catalyst, a phosphate-based compound, and a low refractive index fluorine-based compound.

9. The photopolymer composition according to claim 8, wherein the low refractive index fluorine-based compound includes at least one functional group selected from the group consisting of an ether group, an ester group and an amide group, and at least two difluoromethylene groups.

10. A hologram recording medium produced from the photopolymer composition of claim 2.

11. An optical element comprising the hologram recording medium of claim 10.

12. A holographic recording method comprising selectively polymerizing photoreactive monomers contained in the photopolymer composition of claim 2 by a coherent laser.

13. The optical element of claim 11, wherein the optical element includes a hologram display device.

* * * * *